United States Patent [19]

Segerstrom et al.

[11] Patent Number: 5,663,718
[45] Date of Patent: Sep. 2, 1997

[54] DEVICE FOR THE AUTOMATIC TESTING OF JOINTS IN ELECTRICAL HIGH VOLTAGE LINES

[75] Inventors: Bo Torbjorn Segerstrom, Malmkoping; Stig Erik Arne Eriksson, Vallentona, both of Sweden

[73] Assignee: Vattenfall AB, Stockholm, Sweden

[21] Appl. No.: 386,493

[22] Filed: Feb. 10, 1995

Related U.S. Application Data

[63] Continuation-in-part of PCT/SE93/00666, filed Aug. 11, 1993 published as WO94/04936, filed Mar. 3, 1994.

[30] Foreign Application Priority Data

Aug. 12, 1992 [SE] Sweden ................................. 9202359

[51] Int. Cl.⁶ .............................. G08C 19/22; H04Q 9/00
[52] U.S. Cl. ........................... 340/870.07; 364/483
[58] Field of Search ................ 340/870.07, 870.17, 340/538; 364/483

[56] References Cited

U.S. PATENT DOCUMENTS

| | | | |
|---|---|---|---|
| 4,573,725 | 3/1986 | Griffiths | 294/82.28 |
| 4,709,339 | 11/1987 | Fernandes | 340/870.17 |
| 4,758,962 | 7/1988 | Fernandes | 340/870.17 |
| 4,818,990 | 4/1989 | Fernandes | 340/870.07 |
| 4,904,996 | 2/1990 | Fernandes | 340/870.07 |
| 4,948,187 | 8/1990 | Blaseck | 294/95 |
| 5,181,026 | 1/1993 | Granville | 340/870.17 |

OTHER PUBLICATIONS

Jannson, Peter, "Lagar ledningar utan avbrott," ERA 6–7, 1993. Jul. 1993.

Ormin, Jonas, "ROBHOT, Hotline Inspection and Control of Overhead Transmission Lines," Vattenfall Transmission Mar. 1995.

Kleveborn, Rolf, "Failing Joints in Transmission Lines", Vattenfall Transmission, Mar. 1995.

Örmin, Jonas, "ROBHOT®, Base Single and Base Duplex, Hotline Inspection and Control of Overhead Transmission Lines", Vattenfall Transmission, Mar. 1995.

*Primary Examiner*—Thomas Mullen
*Assistant Examiner*—Timothy Edwards, Jr.
*Attorney, Agent, or Firm*—Robert Platt Bell & Associates, P.C.

[57] ABSTRACT

A device for automatic testing of electrical high voltage lines is described, comprising a support (1), a driving wheel (2) for lying against the line (3) with a remotely controlled device (4) and a means for remotely controlled automatic measurement of physical data at the joint (11) in question). Means for the transfer of measurement data to a receiver is provided along with a shielding means (15) to shield the transfer means. The device is characterized primarily in that it is provided with a guide rails means (7,8,9) for steering of the device, carried by a lifting means such as a helicopter or crane for lying the driving wheel against a line. Physical measurement may comprise contacting as well as non-contacting measurement in the vicinity of and at a joint in question. To compensate for voltages which may be induced in the measuring means, a compensation circuit is provided. The compensation circuit may be provided with a flat coil which may be rotated by a stepper motor or the like. Voltage in the measuring circuit may be measured continuously during stepwise rotation of the flat coil to determine a measured voltage minima and maxima. The minimum voltage measured correctly compensates for currents induced in the measuring circuit.

16 Claims, 6 Drawing Sheets

DEVICE FOR THE AUTOMATIC TESTING OF JOINTS IN ELECTRICAL HIGH VOLTAGE LINES

CROSS-REFERENCE TO RELATED APPLICATIONS

This application is a continuation-in-part of International Application PCT/SE93/00666, with an international filing date of Aug. 11, 1993, now abandoned.

FIELD OF THE INVENTION

The present invention relates to a device for the automatic testing of lines for high voltage electricity, comprising a support, a driving wheel for lying on the line with a remotely controlled driving device, means for remotely controlled automatic measurement of physical data at the joint in question and means for the transfer of measurement data to a receiver and shielding means for these means.

BACKGROUND OF THE INVENTION

One apparatus disclosed in U.S. Pat. No. 4,904,996 (the '996 patent) is known in the art for measuring physical data from electrical lines. However, it seems that the usefulness of the apparatus of the '996 patent may be somewhat limited, as it only measures physical data in the form of electromagnetic radiation. Furthermore, the apparatus of the '996 patent lacks means for steering the measuring device onto the electrical line in question. It does not seem to be probable that the device in the '996 patent may be able to replace the manual work that has hitherto been connected to maintenance work on electrical high voltage lines. As these must be provided with joints it is necessary to test these joints with certain time intervals, and to repair them if needed. For safety reasons, such manual work is normally done after the high voltage line has been taken from operation, that is to say been made dead electrically.

SUMMARY AND OBJECTS OF THE INVENTION

It is an object of the present invention to provide a device for measuring physical data at a joint of a high voltage electrical line which may be utilized when the high voltage is in operation.

It is a further object of the present invention to provide a device for measuring physical data at a joint of a high voltage electrical line which may be generally usable for all types of physical measurements and that can safely be steered in to lie upon the line that is to be tested.

It is a further object of the present invention to provide a device for measuring physical data at a joint of a high voltage electrical line which may be safely be steered in to lie upon the line that is to be tested.

According to the invention such a device is characterized primarily in that it is provided with guide rail means for steering the measuring device. The measuring device may be carried by lifting means such as a helicopter or crane, for applying a driving wheel to an electrical line. Physical measurement means, both non-contacting as well as contacting, are carried by the measuring device in the vicinity of and at the joint in question.

In a first embodiment of the present invention, a support is provided, in addition to the driving wheel, with at least a second wheel, arranged in a distance perpendicularly to the driving wheel, the second wheel being adjustable as to the distance to the driving wheel. With this arrangement the device may be adapted to utilization in high voltage systems with parallel lines.

The guide rail means may be formed in different ways, however, in the preferred embodiment, the guide rail means comprises two substantially triangular formed guide elements, each of which attached to its horizontal side of the support with the guiding elements diverging downward and outwardly.

In the preferred embodiment, the lifting means comprises a helicopter. Considering the need to release the device from a helicopter in the event of an emergency it is suitable to provide a remotely controlled releasable lifting element between the support and the lifting means.

The releasable lifting element may be constructed in different ways. The device may comprise a guide means attached to the support (e.g., in the form of a upwardly diverging hopper), the guide means being provided with a first locking element. A second locking element is attached to a line means intended to be carried by the lifting means. The first and second locking elements are constructed to from together automatically such that the lifting element is in the form of a locking, carrying joint which is remotely controlled releasable.

for safety reasons, insulators may be arranged between the lifting element and the support. In addition, the line means may be provided of a non-conducting material (e.g., Kevlar™).

The means for transferring measurement data to a receiver, for example in a helicopter, may comprise a fiber optic link. Since the lifting means (e.g., helicopter) may be separated from the support, the fiber optic link may suitably comprise a first and second parts which may be kept in fiber optic connection by a connecting means, formed to bring the two parts apart under the influence of a predetermined tensile force.

A means for measuring electrical voltage over a joint suitably comprises two pointed elements, provided to automatically, by remote control, penetrate into the surface layer of an electrical line and thus form the ends of an electrical measurement shunt circuit over the joint.

A means for the measurement of amperage through the joint, on the other hand, may suitably comprise an measurement loop, which may be formed from at least two clamp parts in such a way that it will automatically open and then close around the line when it is lead against the line, and automatically open when it is withdrawn from the line.

A means for the measurement of the temperature over a joint comprises an element, provided to automatically, by remote control, measure the temperature by an IR-sensor or by a probe that is forced to make a surface contact with the joint.

BRIEF DESCRIPTIONS OF THE DRAWINGS

The present invention will be described with reference to the following Figures in which.

DETAILED DESCRIPTION OF THE INVENTION

Figure 1A:
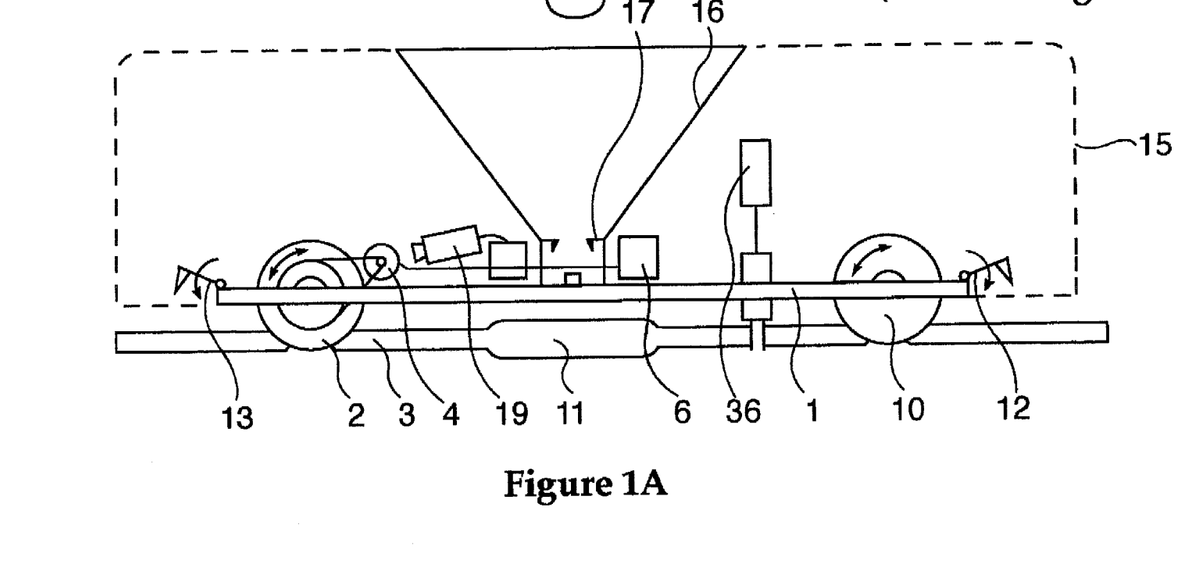
FIG. 1A is a view of a first embodiment of the device according to the present invention, partly in section.
Figure 2:
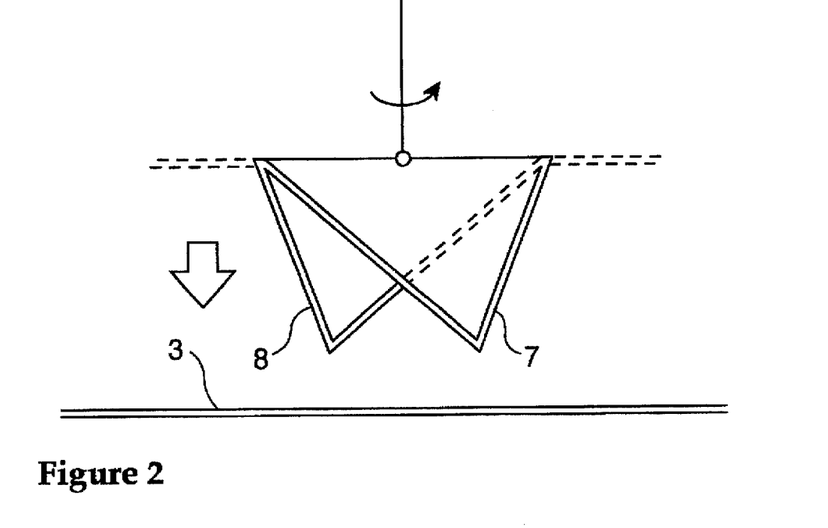
FIG. 2 illustrates a guide rail means for steering the device to lie against an electrical line.

Referring now to FIG. 1A, a support 1 is coupled to a driving wheel 2 for applying to a line 3, driven by driving device 4. A first remotely controlled device for controlling driving device 4 comprises a transmitter 5 and a receiver 6. From FIG. 2 the form of guide rail means 7, 8 for steering the device to lying its driving wheel 2 and other wheel 10 on line 3 and its joint 11 may be seen. A camera means 19 with a device for remotely transferring a picture of joint 11 and its environs is shown in FIG. 1A.

In addition, there are means for remotely controlled automatic measurement of physical data at joint 11. Two pointed elements 12, 13 arranged to automatically, by remote control, be brought to penetrate into the surface layer of line 3. Elements 12, 13 form the ends of an electrical measurement shunt loop over joint 11.

In addition, there is provided means 36 for the measurement of amperage through joint 11. Means 36 may, as is shown in FIG. 8, be formed like a spring tensioned claw which opens when it is lead over line 3, and then closes around line 3 such that a circuit is formed in a way known per se for the measurement of amperage through line 3 and thus through joint 11.

In addition, there is provided means 14 for the measurement of temperature on joint 11. Means 14, as is shown in FIG. 1A, is arranged to automatically, by remote control, be brought to measure the temperature by an IR-sensor or by a probe that is forced to make a surface contact with the joint.

Figure 8:
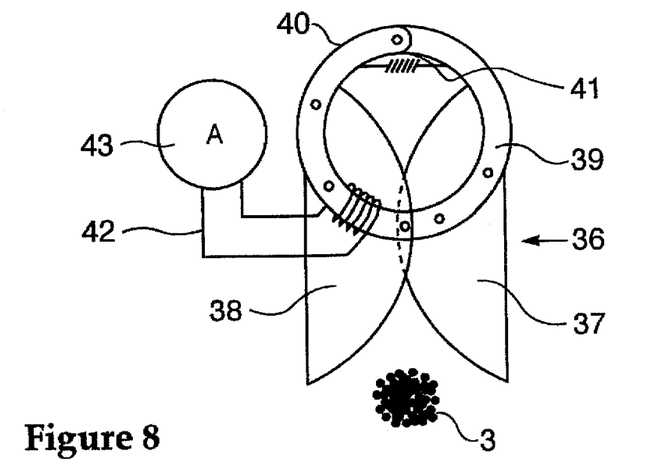
FIG. 8 illustrates a means for measuring amperage through a joint.

According to FIG. 8, means 36 comprises two guide plates 37, 38, each attached to a ring halve 39 and 40 typically made of iron and kept together by spring 41. On one of the ring halves, there is provided a coil as part of a circuit 42, in which a current is induced, the strength of which may be read on ammeter 43.

The apparatus of the present invention is furthermore provided with, although not shown, necessary measurement circuits and means for the wireless transfer of measurement data to a receiver. An important part of the apparatus of the present invention is shielding device 15 for shielding the means for automatic measurement of physical data to a uniform potential.

Figures 1B, 1D:
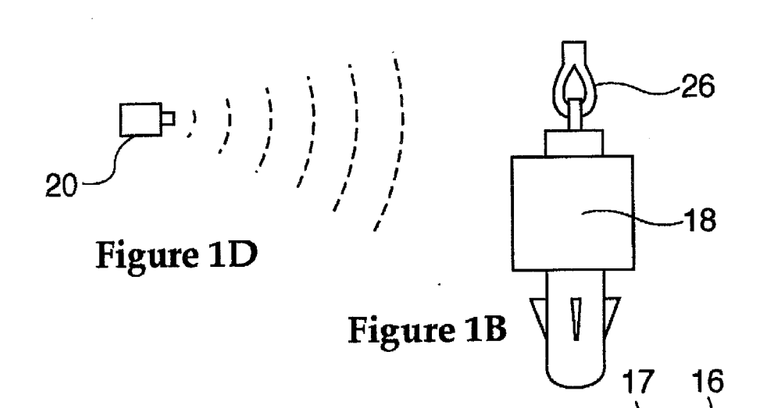
FIG. 1B illustrates a second locking element intended to be carried via line means by a lifting means such as a helicopter.
FIG. 1D illustrates a second device for remotely controlling the second locking element.

The apparatus of the present invention further comprises a guide means 16 in the form of a hopper, open upwardly, provided with a first locking element 17, intended to cooperate with a second locking means 18, attached to a line means intended to be carried by a lifting means such as a helicopter, crane or the like. Locking elements 17, 18 are constructed to form automatically a locking carrying joint which may be releasable by remote control of a second remote control device 20.

Figure 4:
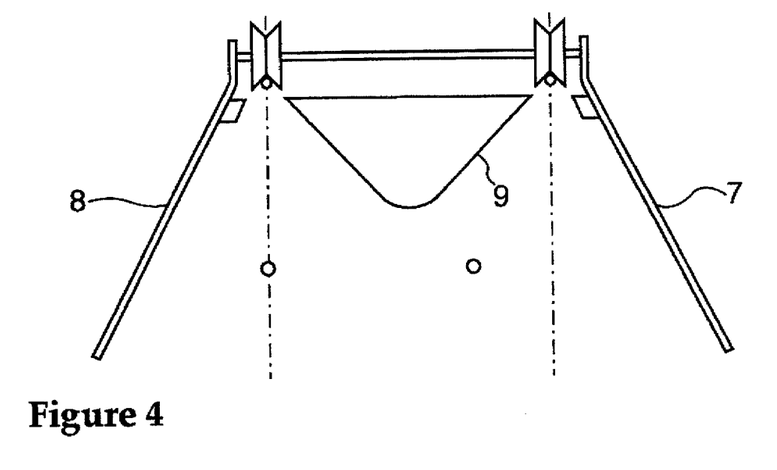
FIG. 4 illustrates a view along two lines of the guide rail means with driving wheels and an extra wheel.
Figure 5:
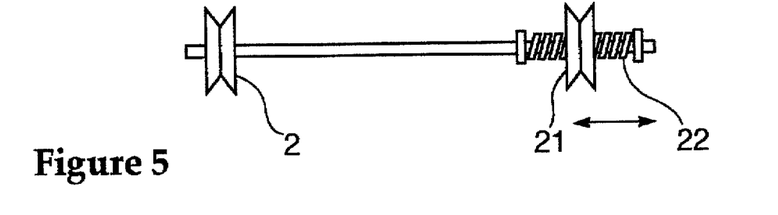
FIG. 5 illustrates a driving wheel with an extra adjustable wheel.

In FIGS. 4 and 5, and embodiment of the device is shown, with an extra wheel 21 on the game shaft as driving wheel 21, intended to lie on a line parallel to line 3. In an alternative embodiment, extra wheel 21 may be spring tensioned by spring 22 in order to adapt to varying distances between line 3 and a parallel line.

Figure 3:
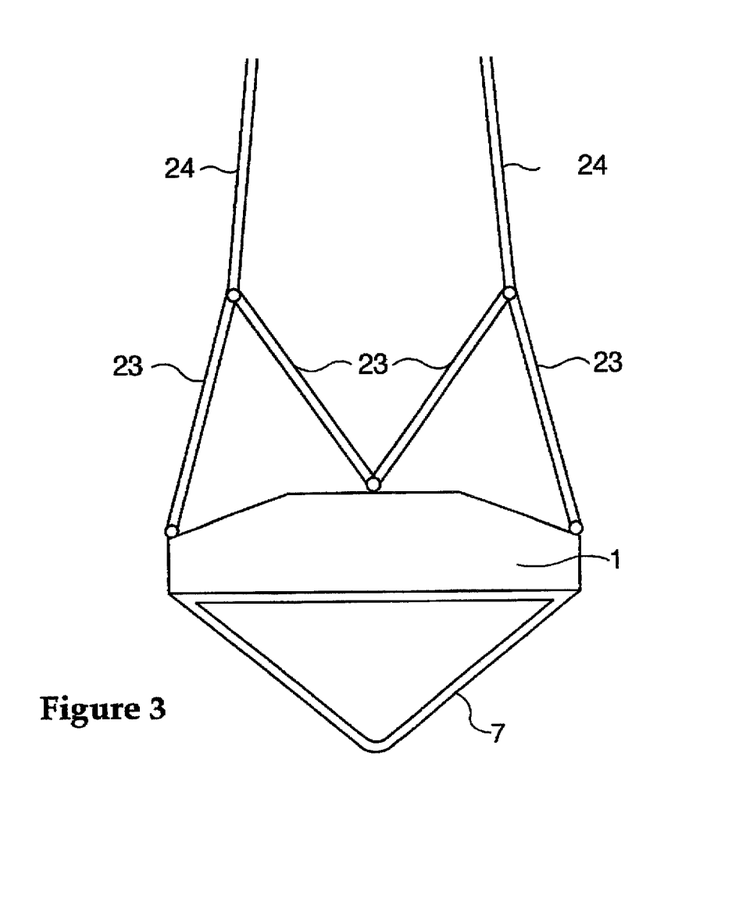
FIG. 3 illustrates an alternative form of lifting the support with insulators and two line means.
Figure 6:
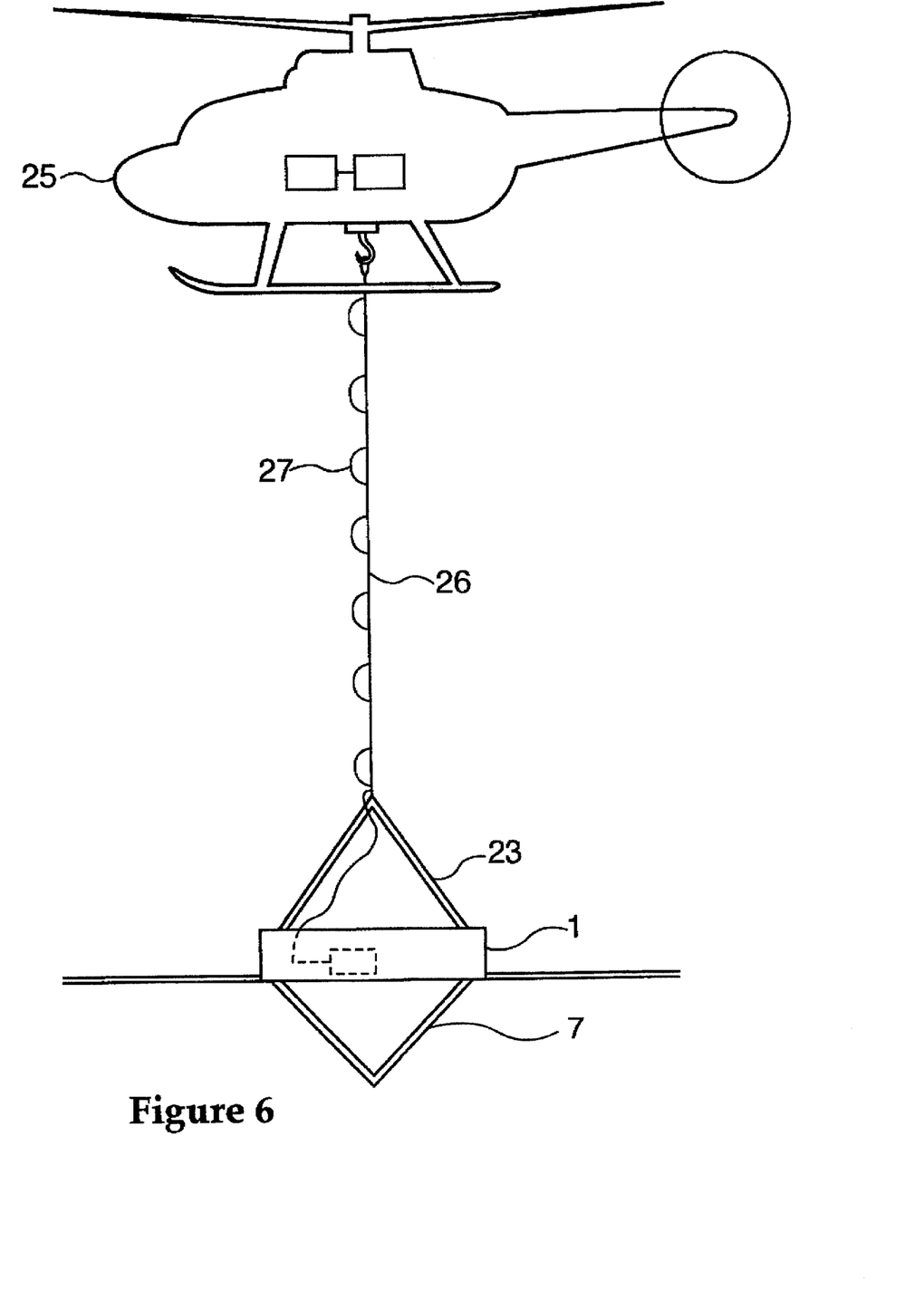
FIG. 6 illustrates an alternative embodiment of the device according to the present invention, carried by a helicopter.
Figure 7:
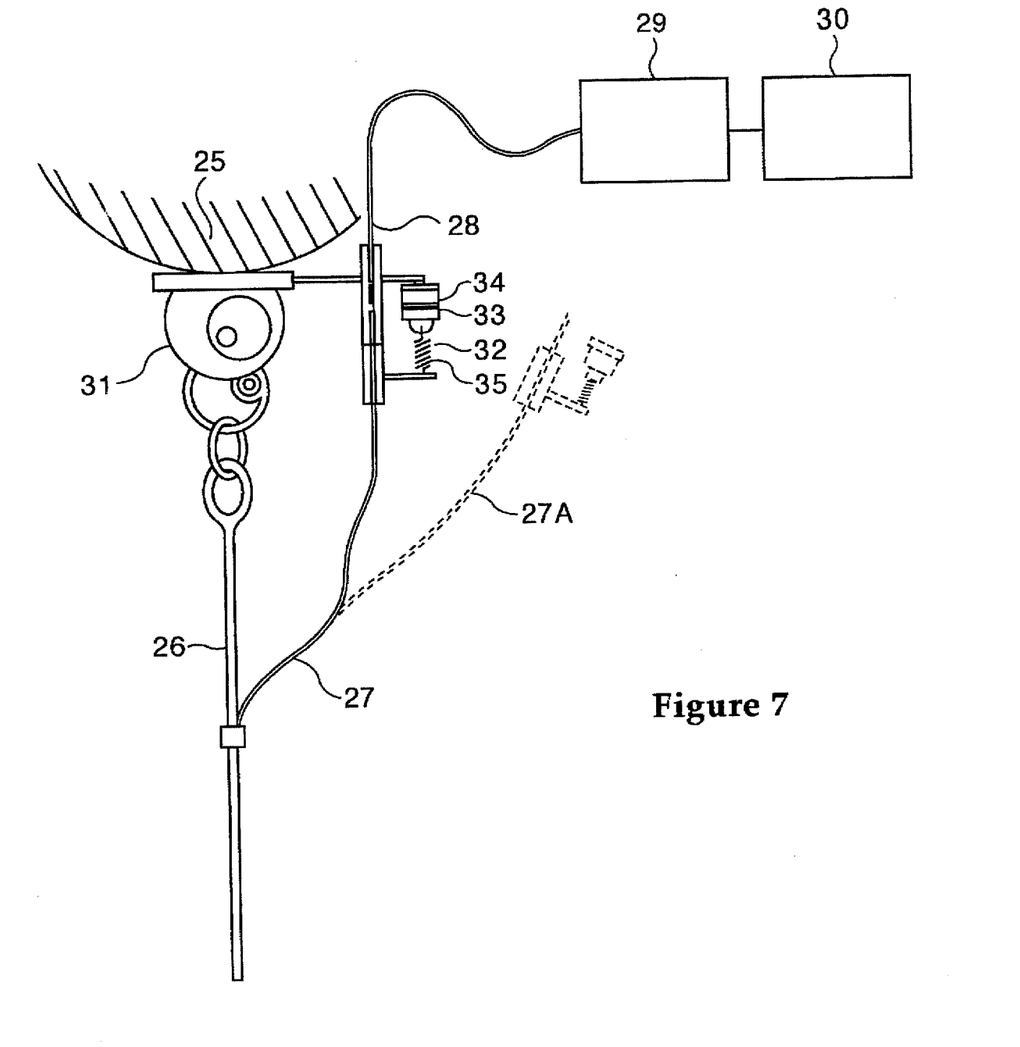
FIG. 7 illustrates a detail of a releasable lifting element and fiber optic link in two parts, with releasable connecting means.

In FIGS. 3, 6, and 7, there is shown yet another alternative embodiment of the present invention. In this alternative embodiment, there are provided four insulators 23, attached to support 1. Insulators 23 are also connected, as is shown in FIG. 3, to two line means 24, which may be carried by a lifting means. FIGS. 6 and 7 are illustrated as an example with a helicopter as a lifting means carrying line 26.

The transfer of measurement values from the means for the measurement of physical data may be performed by a fiber optic link 27, 28 to an opto-converter 29 and further to a computer 30 in the helicopter. Carrying line 26 may be kept connected to helicopter 25 by lifting releasable element 31, controlled from the helicopter. In addition, first and second parts 27 and 28 of the fiber optic link may be kept in fiber optic connection by connecting means 32 which may be provided to bring the two parts 27, 28 to separate under the influence of a predetermined tensile force. This predetermined tensile force may occur, for example, in an emergency where the lifting means must be separated from the apparatus of the present invention.

Connecting means 32 may comprise two permanent magnets 33 and 34 which may be kept under a predetermined pretension by tensile spring 35.

Figure 9:
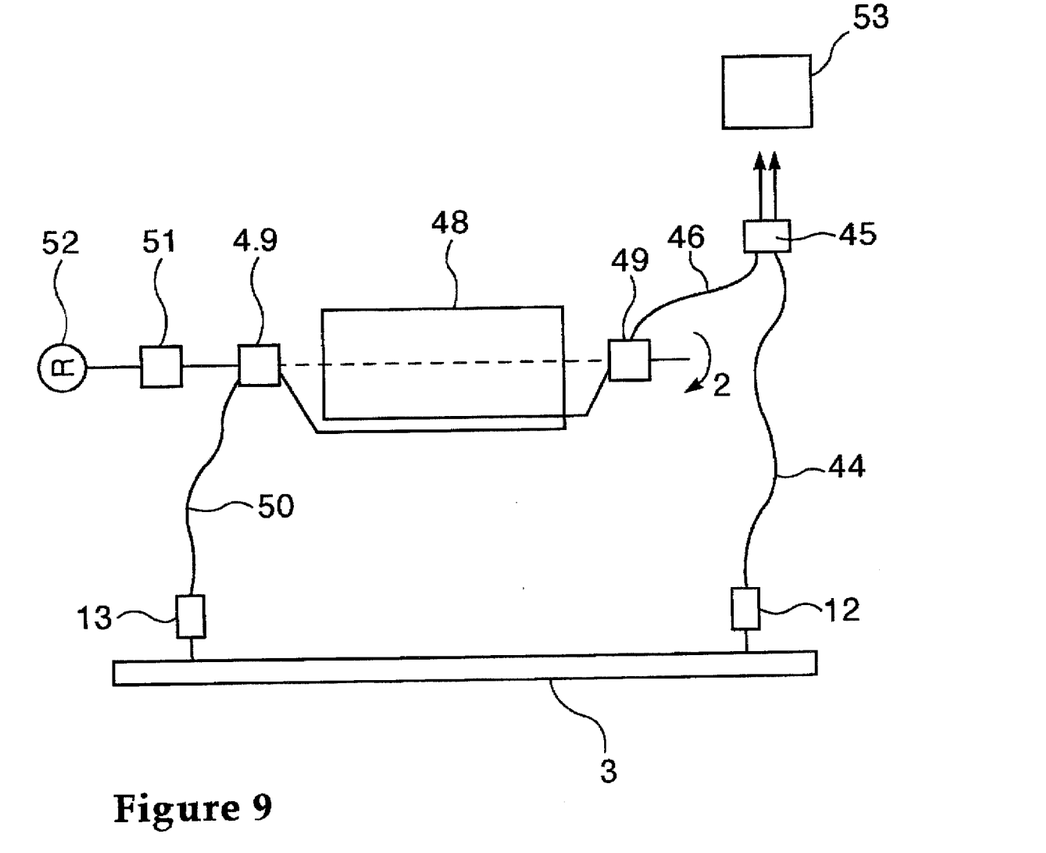
FIG. 9 illustrates a device for compensating the inductive voltage when measuring the contact resistance at a joint by alternating current.

FIG. 9 illustrates a device for compensating the inductive voltage when measuring the contact resistance at a joint by alternating current. When measuring the contact resistance at a joint by alternating current there may be an inductive voltage Uj created in the measuring circuit which may be the same magnitude or larger than the resistive voltage drop Ur over the joint. To avoid this error, the measuring system must be formed in such a way that the inductive voltage in the measuring circuit is eliminated by compensation. According to yet another embodiment of the present invention, a further inductive voltage Uk is introduced in the measuring circuit of the same magnitude as inductive voltage Uj but in a direction opposite to that of inductive voltage Uj.

Figure 1C:
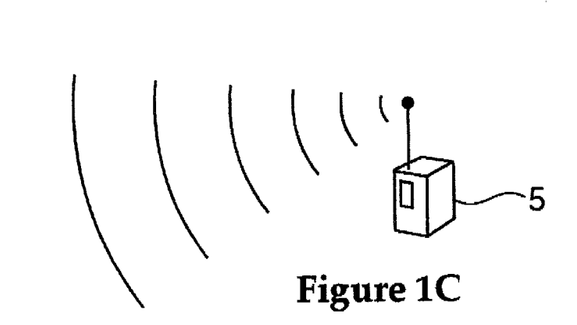
FIG. 1C illustrates a first device for remotely controlling the driving device and automatic measurement of physical data.

The resultant device, which may be applied to the apparatus of FIG. 1, is illustrated schematically in FIG. 9. The apparatus of FIG. 9 comprises two pointed contact elements 12 and 13 used to contact line 3 at both sides of a joint. The measuring circuit thus comprises a conduit 44, a measuring instrument 45, and a conduit 46 in contact with a sliding contact 47 in which a flat coil is journalled. The other end of flat coil 48 is journalled in another sliding contact 49, connected via conduit 50 to pointed contact element 13. Flat coil 48 may be rotated stepwise by a motor 51 and the instant angle ∝ may be measured by angular sensor 52.

Flat coil 48 may comprise a thin flat coil and may be arranged such that its axis is parallel to line 3. To make flat coil 48 more versatile it may be designed such that a chosen number of windings may form the coil for different measuring situations. The opposite inductive voltage is achieved by winding the coil such that the winding direction is opposite that of the measuring circuit. Thus, the magnetic field from the line in which there is current flowing will pass partly through the portion of the measuring circuit which is to be compensated and partly through the flat coil 48 such that the voltage induced in the measuring circuit and flat coil 48 are of opposite polarities.

To achieve full compensation, the magnetic flow in the measuring circuit and flat coil 48 must have the same absolute magnitude. To achieve this, the magnetic flow through the measuring circuit at a given area and the magnetic flow through the coil for the total area of the coil is adapted. With a stationary coil, and with the requirement that the apparatus of the present invention may be adaptable to measure different lines, the total area of the coil would have to be changed. For this reason, according to the present invention, the compensation circuit has been arranged such that it is possible to vary the inductive voltage continuously by turning the coil around its axis.

At a certain angle ∝ the magnetic flow is as large as the magnetic flow in the measuring circuit that is to be compensated. At that angle, the voltage measured is the sought resistive voltage over the joint. If the current flowing through the joint is known, the resistance may be calculated. To enable determination of the correct angle ∝ motor 51 is provided to turn flat coil 48 around stepwise. When flat coil 48 is being turned, varying voltages are being measured, maxima and minima being obtained. Full compensating is achieved at the minima. To make precision measurements, motor 49 may take little steps with great precision. The angle ∝ and the voltage are measured for each step around the turn. To actuate motor 49 and measure minima and maxima, a computer based measuring system 53 may be provided.

What is claimed is:

1. A device for automatic testing joints for electrical high voltage lines, comprising:
   a support frame for lowering into the vicinity of electrical high voltage lines;
   at least one driving wheel, coupled to said support frame, said driving wheel for resting on one of said high voltage electrical lines;
   a driving device, coupled to said driving wheel for driving said driving wheel to move said support frame along said electrical high voltage lines;
   a first remotely controlled device for controlling said driving device to position said support frame in the vicinity of a joint in one of said high voltage power lines;
   remotely controlled means for automatic measurement of physical data at a joint, comprising:
      at least one measurement device for measuring a parameter of said joint to produce measurement data, and
      means for transferring the measurement data to a remotely located receiver;
   shielding means for shielding said remotely controlled means for automatic measurement to a uniform potential; and
   guide rail means, coupled to said support frame, for steering the measuring device during placement and guiding along one of said electrical high voltage lines.

2. The device according to claim 1, further comprising:
   a remotely controlled releasable lifting element coupled to and provided between said lifting support frame and said lifting means.

3. The device according to claim 2, wherein said lifting element comprises:
   guide means coupled to said support frame, said guide means having a hopper-like shape diverging upwardly and provided with a first locking element;
   a line means, coupled to said lifting means, for carrying the device from said lifting means; and
   a second locking element, coupled to said line means, for releasably coupling with said first locking element,
   wherein said first and second locking elements are provided to automatically form together a locking, load carrying joint which is remotely controlled releasable.

4. The apparatus of claim 2 further comprising electrical insulating means provided between said lifting element and the support frame.

5. The device according to claim 1 wherein said means for transferring data comprises a fiber optic link.

6. The device according to claim 5 wherein said fiber optic link comprises a first part and a second part which are kept in fiber optic connection by a connection means provided to bring said first part and said second part apart under the influence of a predetermined tensile force.

7. The device according to claim 1, wherein said remotely controlled means for automatic measurement of physical data at a joint comprises means for measuring electrical voltage drop across the joint, said means for measuring electrical voltage drop across the joint comprises two pointed elements provided automatically, by remote control to penetrate into the surface layer of the high voltage electrical line forming the ends of an electrical measurement shunt circuit over the joint.

8. The device according to claim 7, further comprising:
   a compensation circuit for compensating for parasitic electrical voltages induced in said remotely controlled means for automatic measurement of physical data at a joint by a high voltage electrical line, said compensation circuit comprising:
   a first electrical contact coupled to one of said two pointed elements;
   a voltage measuring device, coupled to the other one of said tow pointed elements;
   a second electrical contact, coupled to said voltage measuring device;
   a coil, rotatably coupled to said first and second electrical contacts;
   an angular position sensor, coupled to said coil for detecting the position of said coil;
   driving means, coupled to said coil, for rotatably driving said coil in predetermined increments; and
   computer means, coupled to said voltage measuring means, said driving means, and said angular position sensor, for rotating said coil in a stepwise fashion and measuring resultant induced voltages across said coil so as to generate a voltage equal to in magnitude but opposite in polarity of said parasitic electrical voltages induced in said remotely controlled means for automatic measurement of physical data at a joint.

9. The device of claim 1, wherein said physical measurement comprises non-contacting as well as contacting measurement in the vicinity of a joint tested.

10. The device according to claim 1, wherein said remotely controlled means for automatic measurement of physical data at a joint comprises means for measuring amperage through the joint, said means for measuring amperage through the joint comprises a measurement loop form from at least two clamp parts such that the measurement loop opens automatically and the closes around a high voltage electrical line when lead toward a high voltage electrical line and releases automatically when withdrawn from a high voltage electrical line.

11. A device for automatic testing joints for electrical high voltage lines, comprising:

a support;

at least one driving wheel, coupled to said support, said driving wheel for being in contact with a high voltage electrical line;

a driving device, coupled to said driving wheel for driving said driving wheel;

a first remotely controlled device for controlling said driving device;

remotely controlled means for automatic measurement of physical data at a joint comprising at least one measurement circuit and means for transferring measurement data measured by said measurement circuit to a receiver;

shielding means for shielding said remotely controlled means for automatic measurement to a uniform potential;

guide rail means for guiding the device along a electrical high voltage line; and an additional wheel provided in a distance perpendicularly to said at least one driving wheel, said second wheel being adjustable as to the distance perpendicularly to the at least one driving wheel.

12. A device for automatic testing joints for electrical high voltage lines, comprising:

a support;

at least one driving wheel, coupled to said support, said driving wheel for being in contact with a high voltage electrical line;

a driving device, coupled to said driving wheel for driving said driving wheel;

a first remotely controlled device for controlling said driving device;

remotely controlled means for automatic measurement of physical data at a joint comprising at least one measurement circuit and means for transferring measurement data measured by said measurement circuit to a receiver;

shielding means for shielding said remotely controlled means for automatic measurement to a uniform potential; and guide rail means for guiding the device along a electrical high voltage line;

wherein said guide rail means comprises two substantially triangular formed guide elements each attached to a corresponding side of said support, said guide elements diverging downwards and outwardly.

13. A compensation circuit for compensating for parasitic electrical voltages induced in measurement instrument by a high voltage electrical line, said compensation circuit comprising:

a first electrical contact coupled to said high voltage electrical line at a first position;

a voltage measuring device, coupled to said high voltage electrical line at a second position;

a second electrical contact, coupled to said voltage measuring device;

a coil, rotatably coupled to said first and second electrical contacts;

driving means, coupled to said coil, for rotatably driving said coil in predetermined increments;

an angular position sensor, coupled to said coil for measuring an angular position of said coil; and computer means, coupled to said voltage measuring means, said driving means, and said angular position sensor, for rotating said coil in a stepwise fashion and measuring resultant induced voltages across said coil so as to generate a voltage equal to in magnitude but opposite in polarity of said parasitic electrical voltages induced in said measurement instrument for automatic measurement of physical data at a joint.

14. A method for automatic testing joints for electrical high voltage lines, comprising the steps of:

placing an apparatus on a high voltage electrical line, the apparatus provided a driving wheel in contact with the high voltage electrical line;

positioning the apparatus in the vicinity of a joint in a high voltage electrical line by actuating said driving wheel so as to move the apparatus along the high voltage electrical line;

engaging at least two pointed members into the high voltage electrical line to measure a voltage drop across the joint; and engaging a loop around the high voltage electrical line to measure current passing through the joint.

15. The method of claim 14, wherein said step of positioning the apparatus comprises the step of positioning the apparatus with a crane or helicopter using a guide rail comprising two substantially triangular formed guide elements each attached to a corresponding side of the apparatus, the guide elements diverging downwards and outwardly so as to guide the apparatus onto the high voltage electrical wire.

16. The method of according to claim 14, further comprising the step of:

positioning a coil rotatably coupled to the high voltage line at first and second locations;

rotatably driving said coil in predetermined increments; and measuring resultant induced voltages across the coil so as to generate a voltage equal to in magnitude but opposite in polarity of parasitic electrical voltages induced in the apparatus.

* * * * *